United States Patent [19]
Kiryu et al.

[11] Patent Number: 5,316,843
[45] Date of Patent: May 31, 1994

[54] MATTED FILM CONTAINING A MATTING AGENT CONSISTING OF AN ORGANIC FILLER AND AN INORGANIC FILLER

[75] Inventors: Naohiko Kiryu, Urawa; Shinichi Yamamoto, Yashio; Masatoshi Tomiki, Koshigaya; Tatuhiko Higami, Tokyo, all of Japan

[73] Assignee: Somar Corporation, Japan

[21] Appl. No.: 615,697

[22] Filed: Nov. 20, 1990

[51] Int. Cl.$^5$ .................................................. B32B 5/16
[52] U.S. Cl. .................................... 428/323; 428/327; 428/331; 428/402; 428/439
[58] Field of Search ............... 428/323, 327, 331, 402, 428/439

[56] References Cited

U.S. PATENT DOCUMENTS

| | | | |
|---|---|---|---|
| 3,411,907 | 11/1968 | Whitmore et al. | 96/67 |
| 3,790,435 | 2/1974 | Tanba et al. | 428/328 |
| 4,010,289 | 3/1977 | Kobayashi et al. | 427/54 |
| 4,066,820 | 1/1978 | Kelly et al. | 428/483 |
| 4,219,220 | 8/1980 | Oda et al. | 428/328 |
| 4,668,569 | 5/1987 | Ito et al. | 428/324 |
| 4,684,675 | 4/1987 | Collier | 523/220 |
| 4,985,399 | 1/1991 | Matsuda et al. | 428/195 |
| 5,035,856 | 7/1991 | Koyama et al. | 428/694 |

FOREIGN PATENT DOCUMENTS 61-40197  2/1986  Japan .

OTHER PUBLICATIONS

Derwent Abstract JP-A-1 024 785.
Derwent Abstract JP-A-61 040 197.

*Primary Examiner*—Paul J. Thibodeau
*Assistant Examiner*—H. Thi Le
*Attorney, Agent, or Firm*—Lorusso & Loud

[57] ABSTRACT

A matted film is disclosed which includes a synthetic resin film, and a mat layer provided over at least one surface of the film and containing a matting agent which is a mixture of 50-95% by weight of an organic filler having an average particle size of 10 μm or less and 5-50% by weight of an inorganic filler having an average particle size of 10 μm and selected from sericite, calcined sericite, kaolin minerals, calcined kaolin minerals, pyrophyllite, calcined pyrophyllite and mixtures thereof.

6 Claims, 1 Drawing Sheet

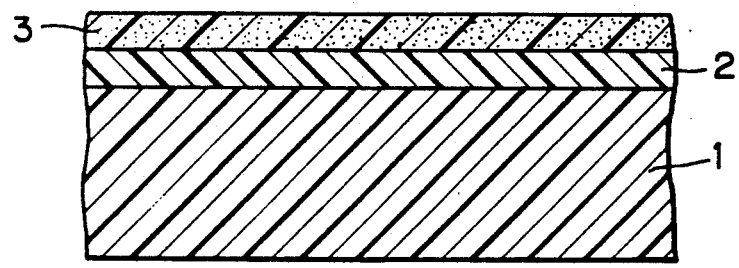

MATTED FILM CONTAINING A MATTING AGENT CONSISTING OF AN ORGANIC FILLER AND AN INORGANIC FILLER

BACKGROUND OF THE INVENTION

This invention relates generally to a composite material and, more specifically, to a matted film having improved pencil and ink receptivity.

Matted films are known which include a transparent plastic film having coated thereon a mat layer containing a binder and finely divided inorganic particles (Japanese Published Unexamined Patent Application No. 60-88037). Because of the presence of the fine particles, the surface of the mat layer is slightly roughened. As a result, the matted film is writable with a pencil, a liquid ink pen (e.g. drawing pen) or a ball-point pen and permits a photosensitive coating to be provided thereon. Thus, such a matted film is widely utilized in many applications, for example, as tracing films for drawing and as image transfer sheets for PPC (plain paper copy).

The known matted films have a problem that tips of pens are abraded during use due to the presence of inorganic particles in the mat layer. Another problem of the conventional matted films is that they are not of a general-use type. Thus, there have been no matted films suited for being written on with any writing instrument.

BRIEF SUMMARY OF THE INVENTION

It is, therefore, an object of the present invention to provide a matted film which has good writability with various writing instruments.

Another object of the present invention is to provide a matted film which causes no abrasion of pen tips.

In accomplishing the foregoing objects, the present invention provides a composite material comprising a film formed of a synthetic resin, and a mat layer provided over at least one surface of said film and containing a matting agent consisting of 50–95% by weight of an organic filler having an average particle size 10 $\mu$m or less and 5–50% by weight of an inorganic filler having an average particle size of 10 $\mu$m or less and selected from the group consisting of sericite, calcined sericite, kaolin minerals, calcined kaolin minerals, pyrophyllite, calcined pyrophyllite and mixtures thereof.

BRIEF DESCRIPTION OF THE DRAWING

Other objects, features and advantages of the invention will become apparent from the detailed description of the invention which follows, when considered in light of the accompanying drawing, in which:

the sole FIGURE is a cross-sectional view diagrammatically showing one embodiment of a matted film according to the present invention.

DETAILED DESCRIPTION OF THE INVENTION

Referring now to FIG. 1, the reference numeral 1 denotes a transparent or translucent film formed of a synthetic resin such as a polyester, a polyamide, a polypropylene, a cellulose acetate, a polyvinyl chloride, a polystyrene, polymethacrylate, a methacrylate copolymer or a polycarbonate. The preferred film 1 is a polyethylene terephthalate film, a cellulose ester film or a polypropylene film. The thickness of the film 1 is not specifically limited but generally in the range of 25–300 $\mu$m.

Designated as 2 is an anchor layer formed of a polymeric material. The anchor layer 2, which is not essential but is optional, has generally a thickness of 0.02–3 $\mu$m and serves to improve the adhesion of a mat layer, which is described hereinafter, to the film 1.

Provided over the anchor layer 2 is the above-mentioned mat layer 3 formed by applying a coating liquid containing a binder and a matting agent to the anchor layer 2. The mat layer 3 has generally a thickness of 1–30 $\mu$m, preferably 2–15 $\mu$m.

The matting agent is a mixture consisting of 50–95% by weight of an organic filler having an average particle size of 0.5–10 $\mu$m, preferably 1–6 $\mu$m and 5–50% by weight of an inorganic filler having an average particle size of 0.5–10 $\mu$m or less, preferably 1–6 $\mu$m. The matting agent conventionally has a particle size of 20 $\mu$m or less.

As the organic filler, there may be used synthetic polymer particles which are preferably spherical in shape. Illustrative of suitable synthetic polymers of which the organic filler is formed are polyolefins (e.g. polyethylene and polypropylene), polystyrenes, polyesters, polyamides, phenol resins, benzoguanamine resins, benzoguanamine-melamine reins and melamine resins. These polymers are desired to have a cross-linked structure. Especially preferred is the use of cross-linked benzoguanamine resins, cross-linked benzoguanamine-melamine resins and cross-linked melamine resins since they give a uniform mat layer.

It is important that as the inorganic filler should be used sericite, calcined sericite, kaolin minerals, calcined kaolin minerals, pyrophyllite, calcined pyrophyllite or mixtures thereof. Examples of kaolin minerals include kaolinite, kaolin, halloysite, metahalloysite, nacrite and mixtures thereof. These inorganic fillers are desired to have a spherical shape.

It is also important that the matting agent should be composed of 50–95% by weight of the organic filler and 5–50% by weight of the inorganic filler. Namely, the weight ratio of the organic filler to the inorganic filler should be in the range of 19:1 to 1:1. When the proportion of the organic filler in the matting agent is less than the above-specified range, the resulting matted film will cause abrasion of ink pens and will become unsatisfactory in both erasability of pencil patterns written thereon and rewritability with pencils after erasure. On the other hand, when the organic filler is used in an excessive amount, the erasability of pencil patterns written on the resulting matted film and the rewritability with pencil after erasure become poor. Preferably, the weight ratio of the organic filler to the inorganic filler is in the range of 11.5:1 to 1.2:1.

The matting agent is generally used in an amount of 5–300 parts by weight, preferably 10–200 parts by weight per 100 parts by weight of the binder.

As the binder, there may be used any conventionally used polymeric material such as a thermoplastic resin, a thermosetting resin or a resin curable by irradiation of UV rays. The binder is generally used in the form of a solution in a suitable solvent or in the form of an emulsion. Examples of suitable binders include thermosetting polyurethane resins, polyester resins, urea-formaldehyde resins, melamine resins and acrylic resins.

A preferred composition of a coating liquid for the formation of the mat layer 3 includes:
(a) an acrylic resin emulsion;
(b) a melamine resin and/or a urea-formaldehyde resin;
(c) a nonionic surfactant;

(d) a crosslinking catalyst; and
(e) the above matting agent.

The above components (a)-(d) will be explained in more detail below.

(a) Acrylic resin emulsion:

An emulsion of an acrylic resin such as a homopolymer or copolymer of an acrylic monomer such as acrylic acid, methacrylic acid, an acrylate (e.g. methyl acrylate or ethyl acrylate), a methacrylate (e.g. methyl methacrylate or ethyl methacrylate) or acrylonitrile is used. Vinyl acetate and styrene are suitable examples of comonomers of the acrylic copolymers. This component serves to impart both suitable rigidity and adhesivity to the mat layer.

(b) Melamine resin/Urea-formaldehyde resin:

Any known water-soluble melamine resin and urea-formaldehyde resin may be used. This component serves to improve resistance to solvents of the mat layer and is generally used in an amount of 0.05-4 parts by weight per part by weight of the acrylic resin (on solid basis).

(c) Nonionic surfactant:

The surfactant is used for the purpose of increasing the viscosity of a coating liquid for the formation of the mat layer so as to prevent precipitation of the matting agent and to improve efficiency of coating operations. The surfactant is generally used in an amount of 0.01-5% by weight based on the coating composition.

(d) Catalyst:

Ammonium chloride and ammonium oxalate may be suitably used. The catalyst is considered to serve to function as a crosslinking catalyst for both the melamine resin (and/or urea-formaldehyde resin) and the acrylic emulsion. The catalyst is generally used in an amount of 0.1-5% by weight based on the total resin content (on solid basis).

The coating composition preferably has a weight ratio of the matting agent to the total resin content (on solid basis) of 0.05-0.7.

The mat layer 3 may be obtained by coating the above coating composition dispersed in a suitable medium such as water, followed by drying and heating generally at 110°-150° C.

The following examples will further illustrate the present invention. Parts are by weight.

EXAMPLE 1

A dispersion containing 10 parts of a melamine resin, 100 parts of an acrylic emulsion (solid content: 43% by weight), 0.4 part of ammonium chloride, 12 parts of a matting agent as shown in Table 1 and 63 parts of water was prepared by homogeneously mixing the above composition. The resultant dispersion was applied over a surface of a polyethylene terephthalate film (thickness: 50 μm) and dried at 140° C. to form a mat layer having a thickness of 5 μm. The average particle sizes of the organic and inorganic fillers used for the formation of the matting agents shown In Table 1 are as follows:

Inorganic filler: 1.4 μm (kaolin)
Organic filler: 2 μm (benzoguanamine resin particles)

The thus obtained matted films were tested for their pen tip abrasion tendency, pencil writability, ink pen writability, ball point pen writability, pencil pattern erasability and pencil rewritability after erasure. Test methods are as follows:

Pen tip abrasion tendency:

Test sample is set on an automatic drawing device having an ink pen. Lines are drawn at a rate of 1000 meter per minute with the pen for a predetermined period of time. The pen tip is observed with a microscope to evaluate the degree of abrasion.

Pencil writability:

Five lines (each 10 cm length) are drawn on test sample with a pencil (core diameter: 0.5 mm, hardness: HB, tradename: HI-POLYMER manufactured by Pentel Inc.). The written lines are observed with a microscope to evaluate writability.

Ink pen writability:

Five lines (each 10 cm length) are drawn on test sample with an ink pen (ink: DRAWING SOL-A (tradename) manufactured by Kaimeisha). The written lines are observed with a microscope to evaluate writability.

Ball point pen writability:

Five lines (each 10 cm length) are drawn on test sample with a ball point pen (MICROTIP PEN (tradename) manufactured by Steadler Japan Inc.). The written lines are observed with a microscope to evaluate writability.

Pencil pattern erasability:

Five parallel lines (each 10 cm length) spaced apart 1 mm are drawn on test sample with a pencil (core diameter: 0.5 mm, hardness: 2H, tradename: HI-POLYMER manufactured by Pentel Inc.). The lines are then rubbed (6 times reciprocations) with a plastic rubber eraser to evaluate the erasability.

Pencil rewritability:

Five parallel lines (each 10 cm length) spaced apart 1 mm are drawn on test sample with a pencil (core diameter: 0.5 mm, hardness: 2H, tradename: HI-POLYMER manufactured by Pentel Inc.). The lines are then rubbed (20 times reciprocations) with a plastic rubber eraser. Then, three parallel lines spaced apart 1 mm are drawn on the sample so that the three lines cross the erased five parallel lines. The difference in density of the newly drawn lines between the crossed portions and non-crossed portions is measured for evaluation of rewritability. The smaller the difference, the better is the rewritability.

Evaluation in the above tests is made by a 5 rank rating. The rank 5 is the best. The test results are also summarized in Table 1.

TABLE 1

| | Sample No. | | | | | | |
|---|---|---|---|---|---|---|---|
| | 1* | 2* | 3 | 4 | 5 | 6* | 7* |
| Ingredient: | | | | | | | |
| Melamine resin | 10 | 10 | 10 | 10 | 10 | 10 | 10 |
| Acrylic emulsion | 43 | 43 | 43 | 43 | 43 | 43 | 43 |
| Matting agent | | | | | | | |
| Kaolin | — | 0.5 | 1 | 2 | 5 | 7 | 12 |
| Benzoguanamine | 12 | 11.5 | 11 | 10 | 7 | 5 | — |
| Ammonium chloride | 0.4 | 0.4 | 0.4 | 0.4 | 0.4 | 0.4 | 0.4 |
| Water | 63 | 63 | 63 | 63 | 63 | 63 | 63 |
| Properties: | | | | | | | |
| Pen tip abrasion tendency | 5 | 5 | 5 | 4 | 4 | 3 | 1 |
| Pencil writability | 5 | 5 | 5 | 5 | 5 | 5 | 5 |
| Ink pen writability | 5 | 5 | 5 | 5 | 5 | 5 | 5 |
| Ball point pen writability | 5 | 5 | 5 | 5 | 5 | 5 | 5 |
| Pencil pattern erasability | 3 | 3 | 4 | 5 | 5 | 5 | 4 |
| Pencil rewritability after erasion | 3 | 3 | 4 | 5 | 5 | 5 | 4 |

*Comparative Sample

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A writing material composite for writing upon with pen or pencil, said composite comprising a film formed of a synthetic resin, and a mat layer provided over at least one surface of said film and containing a matting agent consisting of 50-95% by weight of an organic filler having an average particle size of 10 $\mu$m or less, said organic filler being selected from the group consisting of cross-linked benzoguanamine resins, cross-linked benzoguanamine-melamine resins and cross-linked melamine resins and 5-50% by weight of a kaolin mineral filler having an average particle size of 10 $\mu$m or less.

2. A composite according to claim 1, wherein the weight ratio of said organic filler to said kaolin mineral ranges from 1.2 to 11.5.

3. A composite according to claim 1, wherein the average particle sizes of said organic filler and said kaolin mineral are each 0.5-9 $\mu$m.

4. A composite according to claim 1, wherein the average particle sizes of said organic filler and said kaolin mineral are each 1-5 $\mu$m.

5. A composite in accordance with claim 1 wherein said kaolin mineral is selected from the group consisting of kaolinite, halloysite, metahalloysite and nacrite.

6. A composite according to claim 1 wherein said mat layer consists essentially of said matting agent and a polymeric binder.

* * * * *